(12) United States Patent
Boyd, Jr. et al.

(10) Patent No.: US 11,854,911 B2
(45) Date of Patent: Dec. 26, 2023

(54) METHODS, SYSTEMS, AND APPARATUS FOR CONDUCTING CHUCKING OPERATIONS USING AN ADJUSTED CHUCKING VOLTAGE IF A PROCESS SHIFT OCCURS

(71) Applicant: Applied Materials, Inc., Santa Clara, CA (US)

(72) Inventors: Wendell Glenn Boyd, Jr., Morgan Hill, CA (US); Matthew Boyd, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 147 days.

(21) Appl. No.: 17/185,415

(22) Filed: Feb. 25, 2021

(65) Prior Publication Data
US 2022/0270936 A1    Aug. 25, 2022

(51) Int. Cl.
*H01L 21/66* (2006.01)
*H01L 21/687* (2006.01)
*H01L 21/683* (2006.01)

(52) U.S. Cl.
CPC .......... *H01L 22/12* (2013.01); *H01L 21/6833* (2013.01); *H01L 21/68707* (2013.01)

(58) Field of Classification Search
CPC ............... H01L 22/12; H01L 21/6833; H01L 21/68707; H01L 21/67253; H01L 21/681; H01J 37/32577; H01J 37/32697; H01J 37/32715; H01J 37/32935; H01J 37/3299
See application file for complete search history.

(56) References Cited

U.S. PATENT DOCUMENTS

| 5,325,261 A | 6/1994 | Horwitz |
| 5,459,632 A | 10/1995 | Birang et al. |

(Continued)

FOREIGN PATENT DOCUMENTS

| JP | 2010118459 A * | 5/2010 | ......... H01L 21/6833 |
| JP | 4615670 B2 * | 1/2011 | ......... H01L 21/6833 |

(Continued)

OTHER PUBLICATIONS

International Search Report and Written Opinion for PCT/US2022/012959 dated May 9, 2022.

*Primary Examiner* — Mohammed Shamsuzzaman
(74) *Attorney, Agent, or Firm* — Patterson + Sheridan, LLP

(57) ABSTRACT

Methods, systems, and apparatus for conducting chucking operations are disclosed that use an adjusted chucking voltage if a process shift occurs. In one implementation, a method includes conducting a first processing operation on a substrate in a processing chamber. The first processing operation includes applying a chucking voltage to an electrostatic chuck (ESC) in the processing chamber while the substrate is supported on the ESC. The method includes determining that a process shift has occurred. The determining that the process shift has occurred includes one or more of: determining that a center of the substrate has moved by a post-processing shift relative to a pre-processing location of the center prior to the first processing operation, or determining that a defect count of a backside surface of the substrate exceeds a defect threshold. The method includes determining an adjusted chucking voltage based on the occurrence of the process shift.

12 Claims, 7 Drawing Sheets

(56) References Cited

U.S. PATENT DOCUMENTS

| | | | |
|---|---|---|---|
| 5,563,798 A | 10/1996 | Berken et al. | |
| 5,740,062 A | 4/1998 | Berken et al. | |
| 5,980,194 A | 11/1999 | Freerks et al. | |
| 6,198,616 B1 | 3/2001 | Dahimene et al. | |
| 6,405,101 B1 | 6/2002 | Johanson et al. | |
| 6,556,887 B2 | 4/2003 | Freeman et al. | |
| 6,898,065 B2 | 5/2005 | Mays et al. | |
| 7,039,501 B2 | 5/2006 | Freeman et al. | |
| 8,688,398 B2 | 4/2014 | Sakhare et al. | |
| 9,728,437 B2 | 8/2017 | Tran et al. | |
| 11,037,810 B2 * | 6/2021 | Mochizuki | B25J 9/1697 |
| 2018/0233393 A1 * | 8/2018 | Liu | H01L 21/67253 |
| 2018/0330926 A1 * | 11/2018 | Boyd, Jr. | H01L 21/6831 |
| 2018/0330977 A1 * | 11/2018 | Jiang | H01J 37/32935 |
| 2019/0080949 A1 * | 3/2019 | Boyd, Jr. | C23C 16/4585 |
| 2019/0206712 A1 * | 7/2019 | Boyd, Jr. | H01J 37/32715 |
| 2019/0378697 A1 * | 12/2019 | Lee | H01J 37/32449 |
| 2020/0103294 A1 | 4/2020 | Potter et al. | |
| 2020/0286716 A1 | 9/2020 | Kumar et al. | |
| 2021/0035831 A1 * | 2/2021 | Arakane | H01L 21/68707 |
| 2022/0122874 A1 * | 4/2022 | Li | H01L 21/6833 |

FOREIGN PATENT DOCUMENTS

| | | | | |
|---|---|---|---|---|
| JP | 2012099634 A | | 5/2012 | |
| KR | 20190139061 A | | 12/2019 | |
| WO | WO-2017086246 A1 * | | 5/2017 | G03F 7/0002 |
| WO | 2020038677 A1 | | 2/2020 | |

* cited by examiner

METHODS, SYSTEMS, AND APPARATUS FOR CONDUCTING CHUCKING OPERATIONS USING AN ADJUSTED CHUCKING VOLTAGE IF A PROCESS SHIFT OCCURS

BACKGROUND

Field

Embodiments of the disclosure relate to semiconductor processing, and more specifically to electrostatically chucking a substrate.

Description of the Related Art

Over the life of an electrostatic chuck, process drift can occur. For example, contaminants depositing on the electrostatic chuck and/or roughening of electrostatic chuck surfaces can cause changes in chucking forces applied to substrates. The process drift can hinder processing operations, can cause substrate sticking and/or substrate breakage, can cause substrate pop-off during processing, can cause frontside defects and backside defects on substrates, and can limit the operational lifespan of the electrostatic chuck.

Therefore, there is a need for an improved electrostatic chuck and methods for using the same.

SUMMARY

Electrostatic chucks and methods for using the same are described herein. In one implementation, a method of chucking a substrate includes conducting a first processing operation on the substrate in a processing chamber. The first processing operation includes applying a chucking voltage to an electrostatic chuck (ESC) disposed in the processing chamber while the substrate is supported on the ESC. The method includes determining that a process shift has occurred. The determining that the process shift has occurred includes one or more of: determining that a center of the substrate has moved by a post-processing shift relative to a pre-processing location of the center prior to the first processing operation, or determining that a defect count of a backside surface of the substrate exceeds a defect threshold. The method includes determining an adjusted chucking voltage based on the occurrence of the process shift.

In one implementation, a non-transitory computer readable medium for conducting chucking operations includes instructions that, when executed, cause a plurality of operations to be conducted. The plurality of operations include conducting a first processing operation on a substrate in a processing chamber. The first processing operation includes applying a chucking voltage to an electrostatic chuck (ESC) in the processing chamber while the substrate is supported on the ESC. The plurality of operations include determining that a process shift has occurred. The determining that the process shift has occurred includes one or more of: determining that a center of the substrate has moved by a post-processing shift relative to a pre-processing location of the center prior to the first processing operation, or determining that a defect count of a backside surface of the substrate exceeds a defect threshold. The plurality of operations include determining an adjusted chucking voltage based on the occurrence of the process shift.

In one implementation, a system for processing substrates includes a processing chamber including a processing volume. The system includes an electrostatic chuck (ESC) disposed in the processing chamber. The system includes a controller including instructions that, when executed, cause the processing chamber to conduct a first processing operation on a substrate in the processing chamber. The first processing operation includes applying a chucking voltage to the ESC while the substrate is supported on the ESC. The instructions, when executed, cause a processor to determine that a process shift has occurred. The determining that the process shift has occurred includes one or more of: determining that a center of the substrate has moved by a post-processing shift relative to a pre-processing location of the center prior to the first processing operation, or determining that a defect count of a backside surface of the substrate exceeds a defect threshold. The instructions, when executed, cause the processor to determine an adjusted chucking voltage based on the occurrence of the process shift.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Aspects of the present disclosure relate to methods, systems, and apparatus for conducting chucking operations using an adjusted chucking voltage if a process shift occurs.

Figure 1:
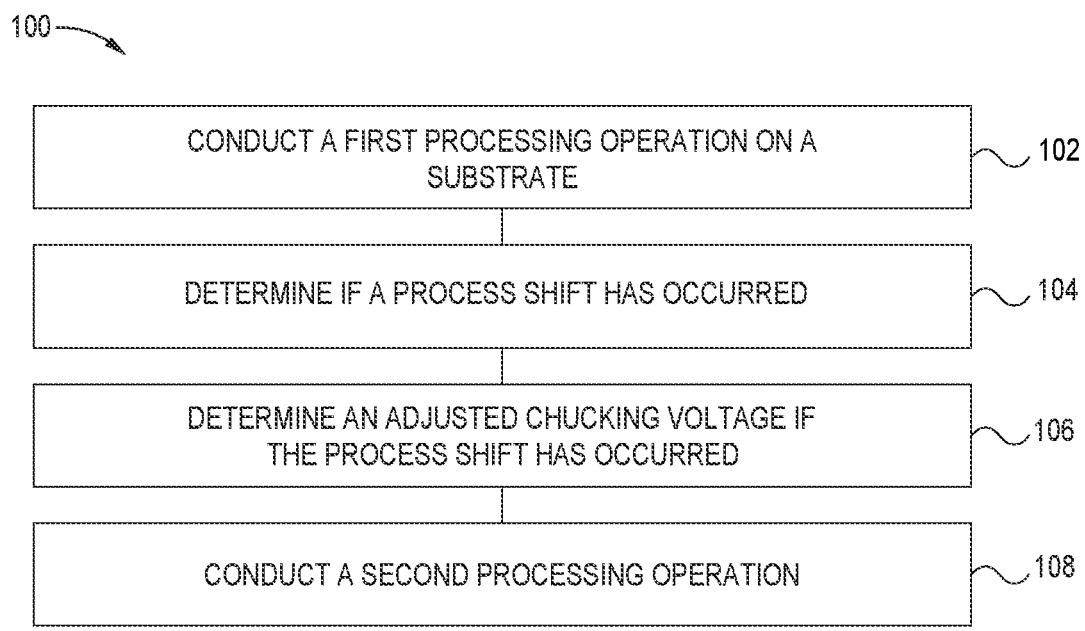
FIG. 1 is a block diagram of a method of chucking a substrate, according to one implementation.

FIG. 1 is a block diagram of a method 100 of chucking a substrate, according to one implementation. At operation 102, a first processing operation is conducted on the substrate in a processing chamber. The first processing operation includes applying a chucking voltage to an electrostatic chuck (ESC) in the processing chamber while the substrate is supported on the ESC. The chucking voltage is a predetermined chucking voltage selected to generate a target chucking force. The first processing operation includes conducting on the substrate, while supported on the ESC, one or more of an etching operation, a deposition operation, an oxidation operation, an anneal operation, and/or an ion implantation operation.

After operation 102, operation 104 is performed to determine if a process shift has occurred. Occurrence of a process shift is indicative that the predetermined chucking voltage no longer generates the target chucking force due to changes in the condition of the ESC. An ESC that allows a process shift may be referred to as a shifted ESC. The determining if the process shift has occurred includes one or more of: determining if a center of the substrate has moved by a post-processing shift relative to a pre-processing location of the center prior to the first processing operation, and/or determining if contamination of a backside surface of the substrate exceeds a defect threshold. Contamination of the backside surface may be determined using a count of defects (such as particles) present on the backside surface of the substrate. The post-processing shift is a displacement of a predetermined threshold from an initial pre-processing position (e.g., center) in the X-Y plane (e.g., the horizontal plane). The predetermined threshold is within a range of 0.5 mm to 10 mm, such as 1 mm to 5 mm. The determining if the center of the substrate has moved by the post-processing shift includes lifting the substrate from the ESC, and moving the substrate past light emitted by one or more laser sensors after the conducting the first processing operation. The moving the substrate past the light emitted by the one or more laser sensors includes moving the substrate while supported on a robot blade. The determining if the center of the substrate has moved by the post-processing shift also includes determining a plurality of locations along an outer perimeter of the substrate, the plurality of locations being located in the X-Y plane, and calculating a post-processing location of the center using the plurality of locations. The determining if the center of the substrate has moved by the post-processing shift also includes determining the post-processing shift between the post-processing location and the pre-processing location.

In one example, the defect threshold is within a range of 5,000 defects to 10,000 defects, such as within a range of 8,000 defects to 10,000 defects. In one example, the defect threshold is greater than 10,000 defects. The determining if the process shift has occurred at operation 104 is conducted in one or more of the processing chamber and/or a second chamber, such as a load lock chamber, a transfer chamber, a buffer chamber, an interface chamber, or a factory interface chamber.

At operation 106, an adjusted chucking voltage is determined if the process shift has occurred. In one embodiment, which can be combined with other embodiments, the determining the adjusted chucking voltage includes transferring a sensor substrate device into the processing chamber and onto the ESC, and measuring a chucking force applied to a sensor substrate device while the sensor substrate device is supported on the ESC. The sensor substrate device includes a plurality of embedded sensors that measure an applied electrostatic force that is applied to the sensor substrate device by the ESC. The adjusted chucking voltage is selected to generate the target chucking force with a shifted ESC. In one embodiment, which can be combined with other embodiments, the determining the adjusted chucking voltage includes conducting a pop-off operation for a workpiece transferred onto the shifted ESC in the first processing chamber. The workpiece includes the substrate or a second substrate.

The pop-off operation includes applying an initial chucking voltage to the ESC, and flowing a backside gas to a backside surface of the workpiece. The initial chucking voltage is a voltage at which the backside gas leaks past an outer edge of the workpiece at a leak rate that is below a leak threshold. The initial chucking voltage can be the same as the chucking voltage applied at operation 102, or can be lower or higher than the chucking voltage applied at operation 102. The pop-off operation also includes, while flowing the backside gas to the backside surface, ramping up or down the initial chucking voltage to a leak voltage at which the backside gas leaks past the outer edge of the workpiece at a leak rate that exceeds the leak threshold. In one example, the backside gas is flowed at a backside pressure of about 16 Torr while a processing volume of the processing chamber is maintained at about 10 mTorr. The initial chucking voltage is ramped up or down in voltage increments, such as increments of 25 Volts or 100 Volts. The leak threshold is within a range of 2.0 standard cubic centimeters per minute (sccm) to 5.0 sccm, such as 2.0 sccm. The adjusted chucking voltage is determined by adding or subtracting a safety voltage margin to or from the leak voltage. The safety voltage margin is added to the leak voltage to provide an operating margin above the leak voltage (for generating the target chucking voltage) if the leak voltage was determined by ramping down the initial chucking voltage to the leak voltage. The safety voltage margin is subtracted from the leak voltage to provide an operating margin below the leak voltage (for generating the target chucking voltage) if the leak voltage was determined by ramping up the initial chucking voltage to the leak voltage. The safety voltage margin determined by multiplying the leak voltage by a ratio factor, and the ratio factor is 0.2 or greater. The safety voltage margin can be, for example, 200 Volts or 300 Volts.

At operation 108, a second processing operation is conducted in the processing chamber. The second processing operation is conducted on the substrate, the second substrate, or a third substrate. The second processing operation includes applying the adjusted chucking voltage to the ESC while the substrate, the second substrate, or the third substrate is supported on the ESC. The adjusted chucking voltage is used to chuck the substrate, the second substrate, or the third substrate to the ESC during the second processing operation. The second processing operation includes one or more of an etching operation, a deposition operation, an oxidation operation, an anneal operation, and/or an ion implantation operation.

Figure 2:
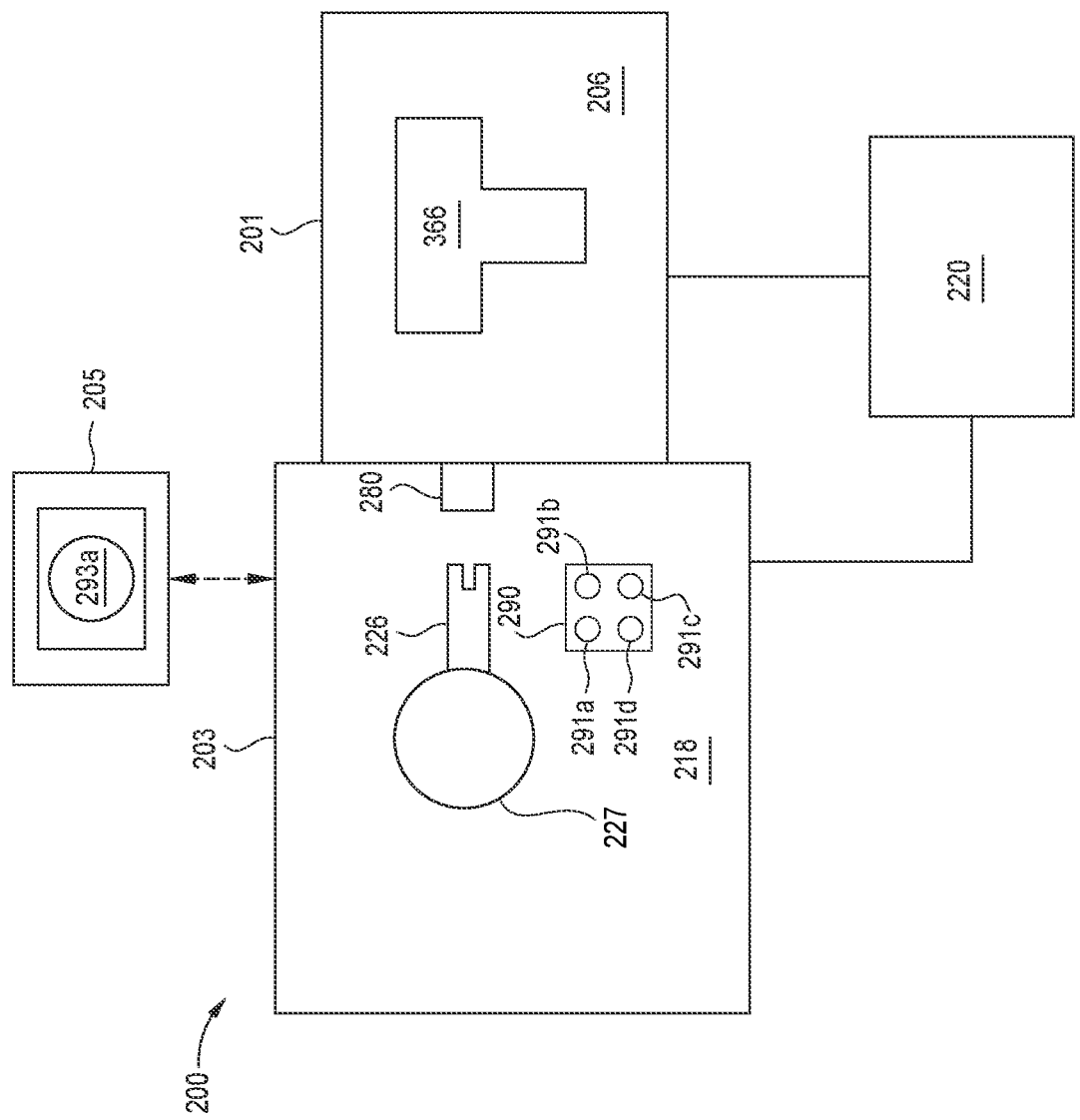
FIG. 2 is a schematic partial view of a system for processing substrates that can be used to perform the method 100 shown in FIG. 1, according to one implementation.

FIG. 2 is a schematic partial view of a system 200 for processing substrates that can be used to perform the method 100 shown in FIG. 1, according to one implementation. The system 200 includes a processing chamber 201 and a second chamber 203. A controller 220 is coupled to the processing chamber 201 and the second chamber 203 to control operations of the processing chamber 201 and the second chamber 203. The second chamber 203 includes a volume 218 and a robot 227 that has a robot blade 226 and is configured to extend and retract the robot blade 226 into and out of a processing volume 206 of the processing chamber 201. The second chamber 203 can be a load lock chamber, a transfer chamber, buffer chamber, an interface chamber, or a factory interface chamber. The second chamber 203 can be directly attached to the processing chamber 201, or the second chamber 203 can be separated from (e.g., indirectly attached to) the processing chamber 201. The robot blade 226 is used to move a substrate between the chambers 201, 203.

The system 200 includes one or more sensors that monitor conditions and/or properties of one or more aspects of the system 200, such as the volume 118 of the second chamber 203, a processing volume 206 of the processing chamber 201, and/or surfaces of a substrate. The system 200 includes one or more modules 290 (one is shown) having one or more sensors 291a-291d (four are shown) disposed in the second chamber 203. At least one of the one or more sensors 291a-291d is a particle sensor configured to measure a defect count of defects (such as contaminants) on backside surfaces of substrates. In one example, the defect count is measured in a tool or chamber that is not directly attached to the processing chamber 201. The sensors 291a-291d can be metrology sensors, on-substrate spectroscopy sensors (such as X-ray fluorescence spectroscopy (XRF) sensors and/or X-ray photoelectron spectroscopy (XPS) sensors), particle counters, cameras, optical sensors, and/or position sensors.

The system 200 includes one or more laser sensors 280 coupled to the second chamber 203. Each of the laser sensors 280 is a part of a local center finder (LCF) for the second chamber 203. The one or more laser sensors 280 can be disposed in the volume 218 or outside of the volume 218. The laser sensors 280 are used to detect at least three locations on the outer perimeter of the substrate (when carried on the robot blade 226) from which the center of the substrate is determined. The measured substrate center can be compared to an expected position based on the robot motion to determine if a shift in position has occurred on the ESC. The present disclosure contemplates that the one or more laser sensors 280 can be disposed in the processing chamber 201 or the third chamber 205.

The system 200 includes a third chamber 205 (a measurement chamber) that interfaces directly or indirectly with the second chamber 203. The third chamber 205 includes a particle sensor 293a configured to measure a defect count of defects on a backside surface of a substrate after a first processing operation is conducted on the substrate in the processing chamber 201. The particle sensor 293a is a metrology sensor, an on-substrate spectroscopy sensor (such as X-ray fluorescence spectroscopy (XRF) sensor and/or X-ray photoelectron spectroscopy (XPS) sensor), a particle counter, a camera, an optical sensor, and/or a position sensor. In one embodiment, which can be combined with other embodiments, the particle sensor 293a configured to measure the defect count is disposed in the third chamber 205 that is different from the processing chamber 201 and is not directly attached to the processing chamber 201. In such an embodiment, the substrate is taken out of the processing chamber 201 prior to taking the defect count measurement, and the defect count is measured while the substrate is disposed in the third chamber 205 that is not directly attached to the processing chamber 201. In one embodiment, which can be combined with other embodiments, the substrate is flipped such that the backside surface of the substrate faces upward and the defect count measurement is taken, such as by using the particle sensor 293a in the third chamber 205. The third chamber 205 can be a load lock chamber, a transfer chamber, buffer chamber, an interface chamber, or a factory interface chamber. The present disclosure contemplates that the particle sensor 293a can be disposed in the second chamber 203 or the processing chamber 205. The present disclosure contemplates that one or more of the sensors 291a-291d in the second chamber 203 can be configured to conduct the operations described for the particle sensor 293a.

The third chamber 205 can include a flipping device that flips the substrate such that the backside surface faces upward. The third chamber 205 can also include a robot, such as a robot similar to the robot 227 disposed in the second chamber 203.

Figure 3A:
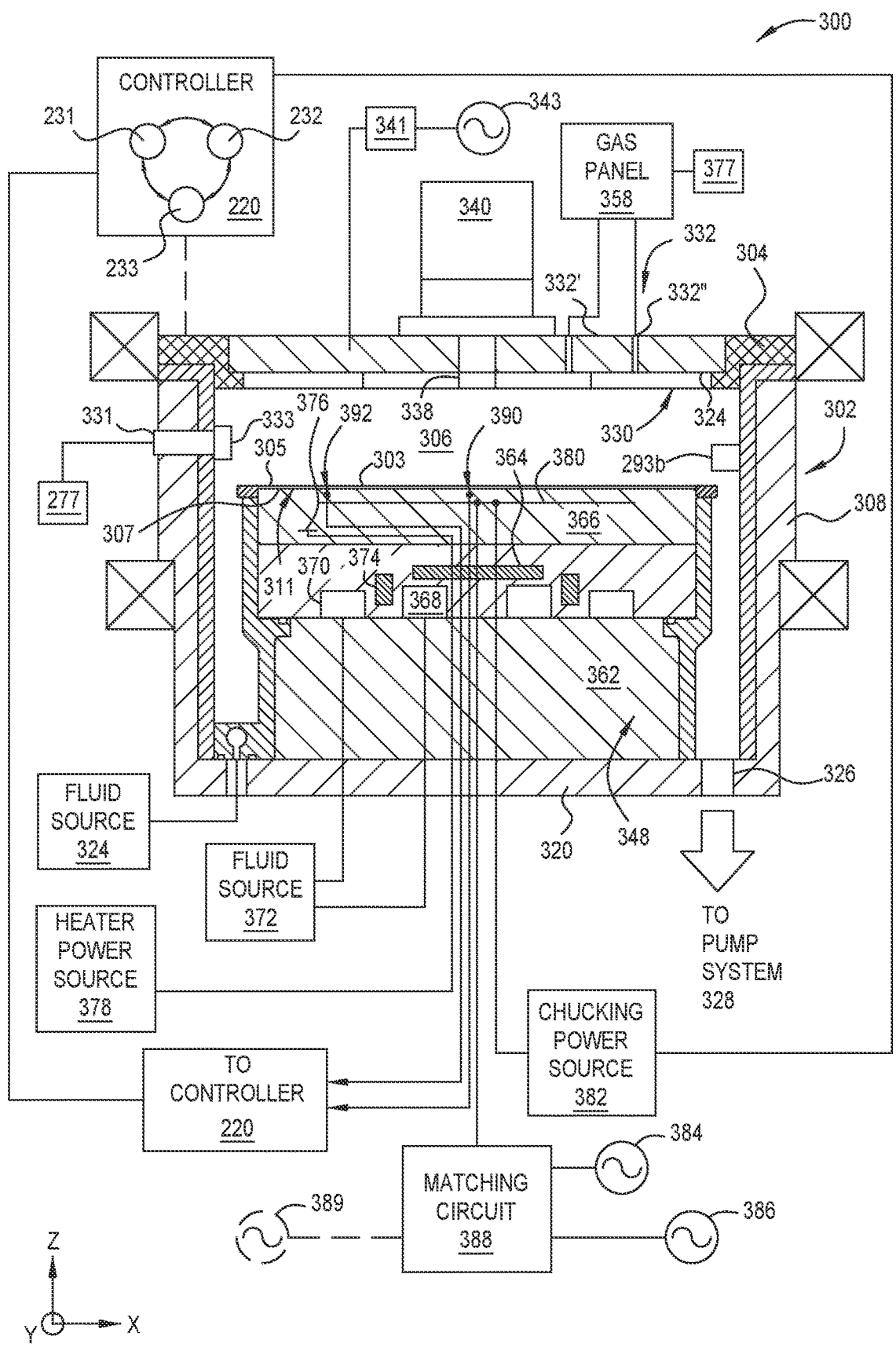
FIG. 3A is a schematic partial sectional view of a processing chamber, according to one implementation.

FIG. 3A is a schematic partial sectional view of a processing chamber 300, according to one implementation. The processing chamber 300 can be used as the processing chamber 201 of the system 200 shown in FIG. 2. The processing chamber 300 is an etch chamber configured to conduct an etching operation on a substrate 303. Suitable processing chambers that may be adapted for use with the aspects disclosed herein include, for example, an ENABLER®, SYM3® or AdvantEdge® Mesa® processing chamber available from Applied Materials, Inc. of Santa Clara, California. The processing chamber 300 includes a chamber body 302 and a lid 304 which enclose a processing volume 306. The chamber body 302 is fabricated from aluminum, stainless steel or other suitable material. The chamber body 302 includes sidewalls 308 and a bottom 310. A substrate access port 331 is defined in a sidewall 308 and a selectively sealed by a slit valve 333 to facilitate transfer of the substrate 303 into and out of the processing chamber 300. An exhaust port 326 is defined in the chamber body 302 and couples the processing volume 306 to a pump system 328. The pump system 328 generally includes one or more pumps and throttle valves utilized to evacuate and regulate the pressure of the processing volume 306 of the processing chamber 300. In one implementation, the pump system 328 maintains the pressure inside the processing volume 306 at operating pressures typically between about 10 mTorr to about 500 Torr.

The lid 304 is sealingly supported on the sidewall 308 of the chamber body 302. The lid 304 may be opened to allow excess to the processing volume 306 of the processing chamber 300. The lid 304 includes a window 342 that facilitates optical process monitoring. In one implementation, the window 342 is comprised of quartz or other suitable material that is transmissive to a signal utilized by an optical monitoring system 340 mounted outside the processing chamber 300. The optical monitoring system 340 is positioned to view at least one of the processing volume 306 of the chamber body 302 and/or the substrate 303 positioned on a substrate support pedestal assembly 348 through the window 342. The substrate 303 includes a frontside surface 305 and a backside surface 307. The optical monitoring system 340 is coupled to the lid 304 and is used to measure aspects of the substrate 303, such as structures formed on the frontside surface 305 and/or a defect count of defects (such particles, for example contaminants) on the backside surface 307. The optical monitoring system 340 may be used to create a defect map of the defects (such as particles) on the backside surface 307. The optical monitoring system 340 may serve as an end point detector, an optical emission spectroscopy (OES), a secondary-ion mass spectrometry (SIMS), a signal detector, an optical detector, combinations thereof, and/or other suitable sensors or detectors associated with the processing chamber 300. The end point detector may be utilized to detect the species in the processing chamber 300, such as in the processing volume 306, e.g., approximate to the frontside surface 305 of the substrate 303. In operation, the optical monitoring system 340 may transmit signals to the controller 220, to facilitate operations and determinations thereof.

A gas panel 358 is coupled to the processing chamber 300 to provide process gases and/or cleaning gases to the processing volume 306. In the implementation illustrated in FIG. 3A, inlet ports 332', 332" are provided in the lid 304 to allow gases to be delivered from the gas panel 358 to the processing volume 306 of the processing chamber 300. In one implementation, the gas panel 358 is adapted to provide fluorinated process gas through the inlet ports 332', 332" and into the processing volume 306 of the processing chamber 300. In one implementation, the process gas provided from the gas panel 358 includes at least a fluorinated gas, chlorine, and a carbon containing gas, an oxygen gas, a nitrogen containing gas and a chlorine containing gas. Examples of fluorinated and carbon containing gases include $CHF_3$, $CH_2F_2$ and $CF_4$. Other fluorinated gases may include one or more of $C_2F$, $C_4F_6$, $C_3F_8$ and $C_5F_8$. Examples of the oxygen containing gas include $O_2$, $CO_2$, $CO$, $N_2O$, $NO_2$, $O_3$, $H_2O$, and the like. Examples of the nitrogen containing gas include $N_2$, $NH_3$, $N_2O$, $NO_2$ and the like. Examples of the chlorine containing gas include HCl, $Cl_2$, $CCl_4$, $CHCl_3$, $CH_2Cl_2$, $CH_3Cl$, and the like. Suitable examples of the carbon containing gas include methane ($CH_4$), ethane ($C_2H_6$), ethylene ($C_2H_4$), and the like.

A showerhead assembly 330 is coupled to an interior surface 314 of the lid 304. The showerhead assembly 330 includes a plurality of apertures that allow the gases flowing through the showerhead assembly 330 from the inlet ports 332', 332" into the processing volume 306 of the processing chamber 300 in a predefined distribution across the surface of the substrate 303 being processed in the processing chamber 300. A remote plasma source 377 may be optionally coupled to the gas panel 358 to facilitate dissociating gas mixture from a remote plasma prior to entering into the processing volume 306 for processing. A RF source power 343 is coupled through a matching network 341 to the showerhead assembly 330. The RF source power 343 can produce up to about 3000 W at a tunable frequency in a range from about 50 kHz to about 200 MHz. The showerhead assembly 330 includes a region transmissive to an optical metrology signal. The optically transmissive region or passage 338 is suitable for allowing the optical monitoring system 340 to view the processing volume 306 and/or the substrate 303 positioned on the substrate support pedestal assembly 348. The passage 338 may be a material, an aperture or plurality of apertures formed or disposed in the showerhead assembly 330 that is substantially transmissive to the wavelengths of energy generated by, and reflected back to, the optical monitoring system 340.

The substrate support pedestal assembly 348 is disposed in the processing volume 306 of the processing chamber 300 below the showerhead assembly 330. The substrate support pedestal assembly 348 holds and chucks the substrate 303 during processing. The substrate support pedestal assembly 348 generally includes a plurality of lift pins (not shown) disposed therethrough that are configured to lift the substrate 303 from the substrate support pedestal assembly 348 and facilitate exchange of the substrate 303 with the robot 227 that extends into the processing chamber 300 through the substrate access port 331. An inner liner 318 may closely circumscribe the periphery of the substrate support pedestal assembly 348.

In one implementation, the substrate support pedestal assembly 348 includes a mounting plate 362, a baseplate 364 and an electrostatic chuck (ESC) 366. One or more materials, such as a bonding material, can be disposed between the ESC 366 and the baseplate 364. The ESC 366 is formed of a ceramic material, such as AlN or $Al_2O_3$. Alternatively, the ESC 366 may be an electrode laminated between polymer sheets. The mounting plate 362 is coupled to the bottom 310 of the chamber body 302 and includes passages for routing utilities, such as fluids, power lines and sensor leads, among others, to the baseplate 364 and the ESC 366. The ESC 366 includes at least one electrode 380 for chucking the substrate 303 to the ESC 366 to retain the substrate 303 below showerhead assembly 330. A chucking power source 382 is coupled to the ESC 366 and is operable to apply a chucking voltage to the electrode 380 to develop an electrostatic force (a chucking force) that chucks the substrate 303 to a chuck interface 311 of the ESC 366. The chucking power source 382 is configured to apply a chucking voltage (e.g., the target chucking voltage, the initial chucking voltage, and the adjusted chucking voltage) to the ESC 366 that is up to 5,000 Volts, such as within a range of 0 Volts to 2,000 Volts.

At least one of the baseplate 364 or the ESC 366 may include at least one optional embedded heater 376, at least one optional embedded isolator 374 and a plurality of conduits 368, 370 to control the lateral temperature profile of the substrate support pedestal assembly 348. The conduits 368, 370 are fluidly coupled to a fluid source 372 that circulates a temperature regulating fluid therethrough. The heater 376 is regulated by a power source 378. The conduits 368, 370 and heater 376 are utilized to control the temperature of the baseplate 364, thereby heating and/or cooling the ESC 366 and ultimately, the temperature profile of the substrate 303 disposed thereon. The temperature of the ESC 366 and the baseplate 364 may be monitored using a plurality of temperature sensors 390, 392. In one implementation, the substrate support pedestal assembly 348 is configured as a cathode and the electrode 380 or a second electrode is coupled to a plurality of RF bias power sources 384, 386. The RF bias power sources 384, 386 are coupled between the electrode 380 disposed in the substrate support pedestal assembly 348 and another electrode, such as the showerhead assembly 330 or ceiling (lid 304) of the chamber body 302. The RF bias power excites and sustains a plasma discharge formed from the gases disposed in the processing region of the chamber body 302. The dual RF bias power sources 384, 386 are coupled to the electrode 380 disposed in the substrate support pedestal assembly 348 through a matching circuit 388. The signal generated by the RF bias power sources 384, 386 is delivered through matching circuit 388 to the substrate support pedestal assembly 348 through a single feed to ionize the gas mixture provided in the processing chamber 300, thus providing ion energy necessary for performing a deposition operation, an etch operation, or other operation. The RF bias power sources 384, 386 are capable of producing an RF signal having a frequency of from about 50 kHz to about 200 MHz and a power between about 0 Watts and about 5000 Watts. An additional bias power source 389 may be coupled to the electrode 380 to control the characteristics of the plasma.

In one mode of operation, the substrate 303 is supported on the ESC 366 of the substrate support pedestal assembly 348 in the processing chamber 300. A process gas and/or gas mixture is introduced into the chamber body 302 through the showerhead assembly 330 from the gas panel 358. A vacuum pump system 328 maintains the pressure inside the chamber body 302 while removing by-products.

Figure 3B:
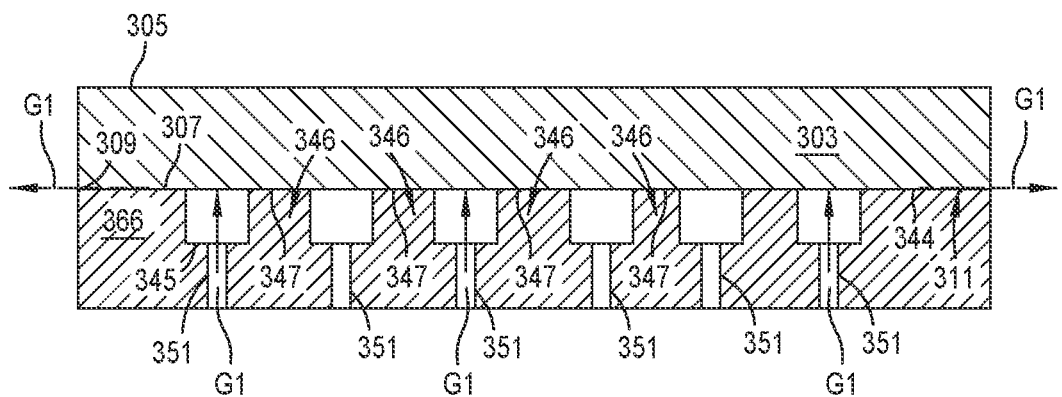
FIG. 3B is an enlarged schematic view of the processing chamber shown in FIG. 3A, according to one implementation.

FIG. 3B is an enlarged schematic view of the processing chamber 300 shown in FIG. 3A, according to one implementation. The chuck interface 311 includes an outer support surface 344. The ESC 366 includes a recessed surface 345 disposed inwardly of the outer support surface 344 and a plurality of mesas 346 protruding upwardly relative to the recessed surface 345. The chuck interface 311 includes upper surfaces 347 of the plurality of mesas 346. The ESC 366 includes a plurality of gas passages 349, such as grooves, between the plurality of mesas 346. The plurality of gas passages 349 are used to flow a backside gas G1 to the backside surface 307 of the substrate 303. The plurality of gas passages 349 are fluidly connected to a gas source that supplies the backside gas G1. The backside gas G1 may be helium or other suitable gas. In operation, the backside gas G1 is provided at controlled pressure into the gas passages to enhance heat transfer between the ESC 366 and the substrate 303. The backside gas G1 can be provided during the first processing operation (of operation 102) of the method 100, the second processing operation (of operation 108) of the method 100, and the pop-off operation of the method 100. The plurality of gas passages 349 can be fluidly connected to the gas source through at least one or more gas openings 351 formed in the ESC 366.

During the pop-off operation described in the method 100, the initial chucking voltage applied using the chucking power source 382 is ramped up or down until the chucking voltage reaches a leak voltage at which the backside gas G1 leaks past an outer edge 309 of the substrate 303 at a leak rate that exceeds the leak threshold. The backside gas G1 leaks (as shown in ghost in FIG. 3B) between the backside surface 307 and the outer support surface 344 as the backside surface 307 at least partially separates from the outer support surface 344. After the pop-off operation the substrate 303 can be removed from the processing chamber 300 and a second substrate (similar to the substrate 303) can be placed on the ESC 366 such that a second processing operation is conducted on the second substrate in the processing chamber 300.

As described, the defect count can be measured outside of the processing chamber 300 and in a different tool or chamber, such as a measurement chamber. The particle count can be used to create a defect count map. The defects may be deposited on the backside surface 307 from the backside gas G1 discussed in FIG. 2B, and/or as a result of contact between the backside surface 307 and other components such as lift pins, the mesas 346, and or the outer support surface 344. A particle sensor 293b is configured to measure the leak rate of the leaking backside gas G1 during the pop-off operation. The one or more laser sensors 280 disposed in the second chamber 203 of the system 201 are aligned below the substrate access port 331 such that the substrate 303 moves past light emitted by the one or more laser sensors 280 as the substrate 303 is transferred toward (e.g., into) and away from (e.g., out of) the processing chamber 300. The one or more laser sensors 280 are configured to determine a center of the substrate 303 each time the substrate 303 moves past the light emitted by the one or more laser sensors 280. A pre-processing location of the center of the substrate 303 is determined using the one or more laser sensors 280 as the substrate is transferred toward (e.g., into) the processing chamber 300. A post-processing location of the center of the substrate 303 is determined using the one or more laser sensors 280 as the substrate is transferred away from (e.g., out of) the processing chamber 300. The present disclosure contemplates that the sensors and/or the operations of the particle sensor 293a, the particle sensor 293b, and/or the one or more laser sensors 280 can be incorporated into the optical monitoring system 340.

The present disclosure contemplates that the one or more laser sensors 280 can be disposed in the processing chamber 300, such as disposed under the substrate access port 331 and mounted to the sidewall 308.

The controller 220 is coupled to the processing chamber 300 to control operation of the processing chamber 300. The controller 220 includes a central processing unit (CPU) 231, a memory 232 containing instructions, and support circuits 233 for the CPU 231. The CPU 231 may be any form of general purpose computer processor that may be used in an industrial setting. The controller 220 controls the processing chamber 300 directly, or via other computers and/or controllers (not shown) coupled to the processing chamber 300. The controller 220 is of any form of a general-purpose computer processor that is used in an industrial setting for controlling various chambers and equipment, and sub-processors thereon or therein. The memory 232, or non-transitory computer readable medium, is one or more of a readily available memory such as random access memory (RAM), read only memory (ROM), floppy disk, hard disk, flash drive, or any other form of digital storage, local or remote. The support circuits 233 are coupled to the CPU 231 for supporting the CPU 231. The support circuits 233 include cache, power supplies, clock circuits, input/output circuitry and subsystems, and the like. Substrate processing parameters and operations are stored in the memory 232 as a software routine that is executed or invoked to turn the controller 220 into a specific purpose controller to control the operations of the processing chamber 300. The controller 220 is configured to conduct any of the methods described herein. The instructions stored on the memory 232, when executed, cause one or more of operations 102-108 of the method 100 to be performed.

The plurality of instructions executed by the controller 220 include instructions that enable the one or more sensors 291a-291d, the one or more sensors 293a, 293b, and/or the one or more laser sensors 280 to obtain measurements. The instructions in the memory 232 of the controller 220 can include one or more machine learning/artificial intelligence algorithms that can be executed in addition to the operations described herein. As an example, a machine learning/artificial intelligence algorithm executed by the controller 220 can improve and/or alter operational parameters based on one or more sensor measurements taken by the sensors 291a-291d, 293a, 293b, and/or 280. The operational parameters can include for example the defect count, the leak rate, the process shift, and/or the adjusted chucking voltage—each described above. The machine learning/artificial intelligence algorithm can be used for multiple electrostatic chucks (ESCs) to improve chucking operations across multiple ESCs for the operational lifetime of the ESCs.

Figure 3C:
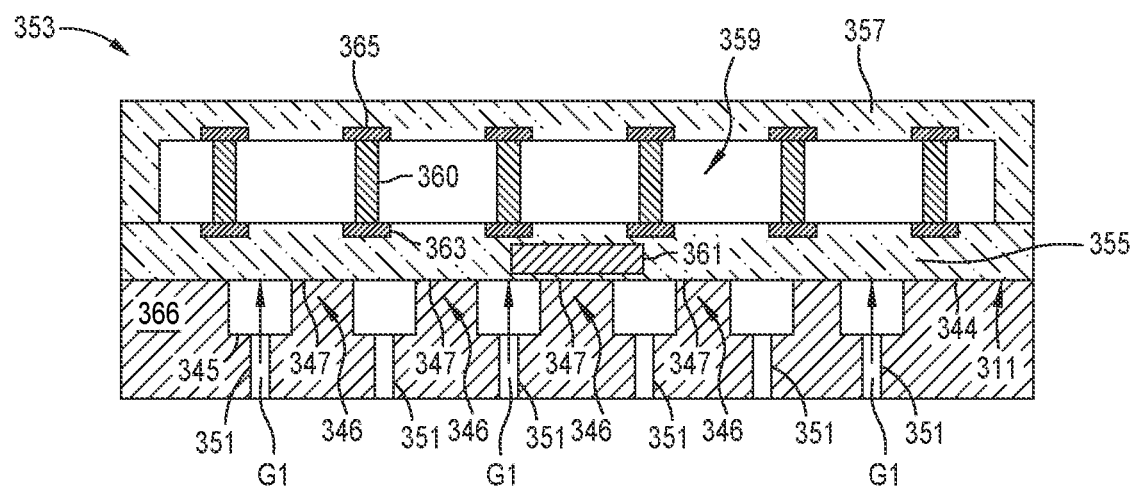
FIG. 3C is an enlarged schematic view of the processing chamber shown in FIG. 3A with a sensor substrate device in the processing chamber, according to one implementation.

FIG. 3C is an enlarged schematic view of the processing chamber 300 shown in FIG. 3A with a sensor substrate device 353 in the processing chamber 300, according to one implementation. The substrate 303 has been lifted from the ESC 366 and removed from the processing chamber 300 using the robot 227. The robot 227 is used to place the sensor substrate device 353 on the ESC 366. The sensor substrate device 353 includes one or more substrates, such as a first substrate 355 and a second substrate 357 that is positioned over the first substrate 355. Surfaces of the first substrate 355 and the second substrate 357 define a cavity 359. A plurality of sensors 360 are positioned in the cavity 240 and between the first substrate 355 and the second substrate 357. The second substrate 357 is attracted to the ESC 366 by the chucking voltage such that the second substrate 357 applies a compressive force on the plurality of sensors 360. By monitoring the plurality of sensors 360, an applied force that is applied to the sensor substrate device 353 by the ESC 366 is measured during application of the chucking voltage. The first substrate 355 and the second substrate 357 can be formed of silicon. The plurality of sensors 360 are pressure sensors, such as spring gauge sensors, piezoelectric sensors, and/or microelectromechanical system (MEMS) sensors. The sensor substrate device 353 includes a computing module 361. The computing module 361 can include components (e.g., a processor and/or a memory) for calculating, recording, and/or communicating measurements of the applied force applied to the sensor substrate device 353 by the ESC 366 during application of the chucking voltage. The measurements can be communicated, for example, to the controller 220 using a transmitter or a wire connection. The measurements can be stored in the sensor substrate device 353 and subsequently downloaded to the controller 220.

The sensors 360 are mechanically and electrically coupled between the first substrate 355 and the second substrate 357. Each sensor 360 is electrically coupled to a respective first conductive pad 363 on the first substrate 355 and/or a second conductive pad 365 on the second substrate 357. The conductive pads 363, 365 can be electrically coupled to the computing module 361 (e.g., by conductive traces (not shown)). The present disclosure contemplates that the first conductive pads 363 or the second conductive pads 365 can be omitted.

Figure 4:
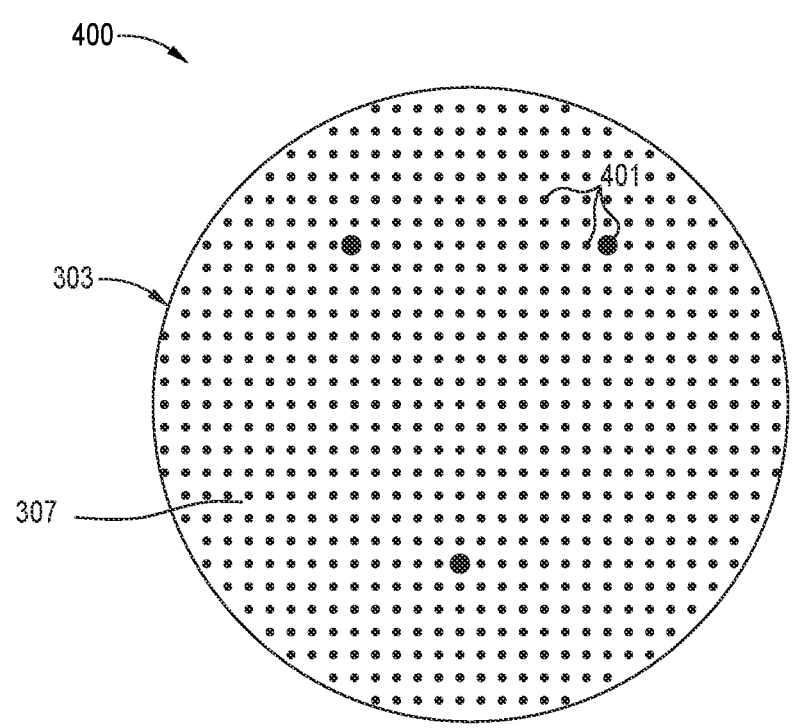
FIG. 4 is a schematic view of a defect count map for the backside surface of the substrate following the first processing operation, according to one implementation.

FIG. 4 is a schematic view of a defect count map 400 for the backside surface 307 of the substrate 303 obtained following the first processing operation, according to one implementation. The backside surface 307 has a plurality of defects 401 present thereon. The defect count map 400 includes a defect count for the plurality of defects 401. The plurality of defects 401 can include contaminant particles, scratches, and/or chips. The plurality of defects 401 may be deposited on the backside surface 307 from a backside gas and/or as a result of contact between the backside surface 307 and other components such as lift pins and/or surfaces of the ESC.

Figure 5:
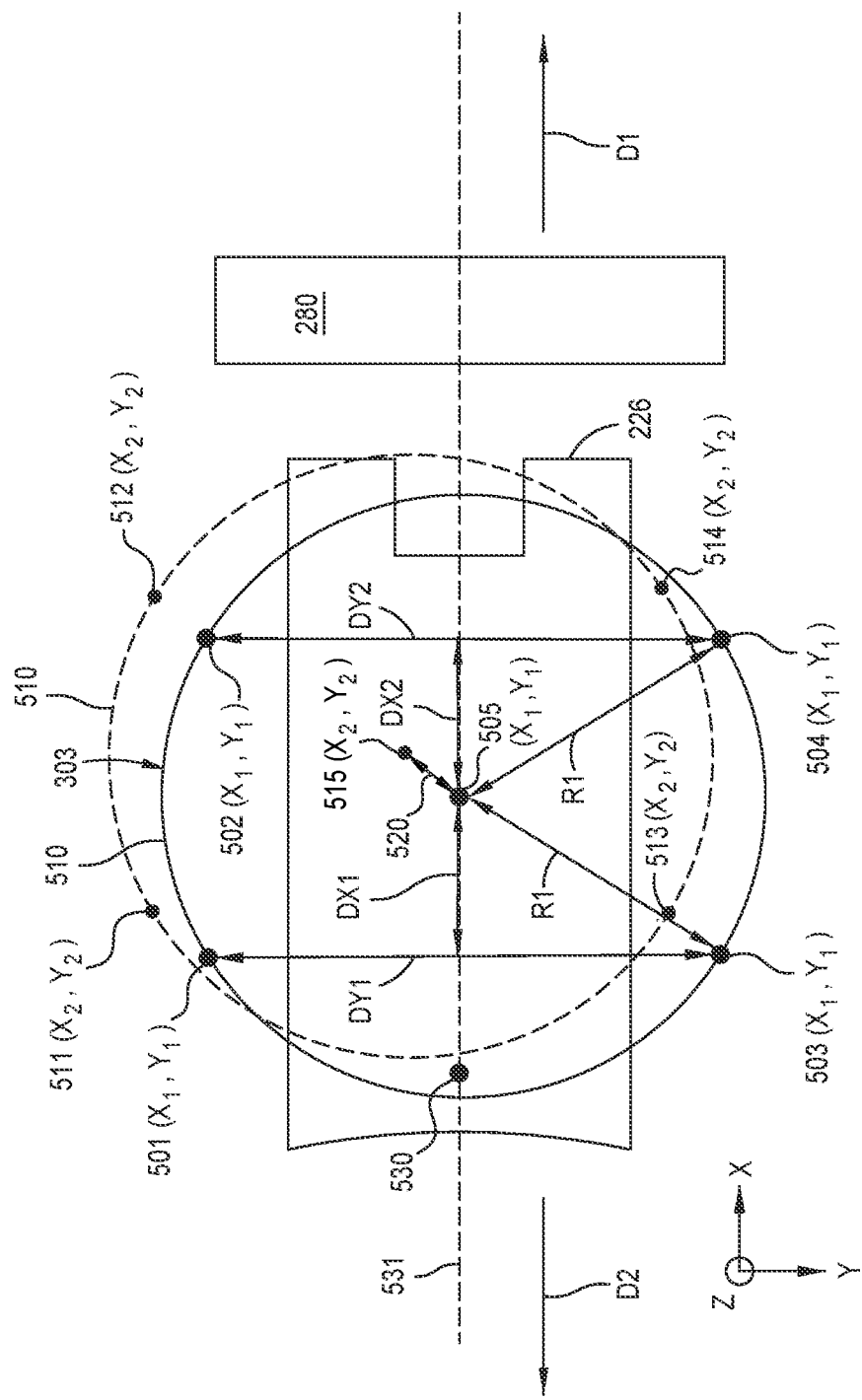
FIG. 5 is a schematic top view of the substrate supported on the robot blade of the robot shown in FIG. 3A, according to one implementation.

FIG. 5 is a schematic top view of the substrate 303 supported on the robot blade 226 of the robot 227 shown in FIG. 3A, according to one implementation. As the robot blade 226 and the substrate 303 supported thereon extends toward the substrate access port 331, toward the ESC 336, and into the processing chamber 300, the robot blade 226 and the substrate 303 move in a first direction D1 in the X-Y plane. As the robot blade 226 and the substrate 303 move in the first direction D1, the substrate 303 moves past light emitted by the one or more laser sensors 280 in the second chamber 203. As the substrate 303 moves past the light emitted by the one or more laser sensors 280 in the first direction D1, the substrate 303 (e.g., the outer perimeter of the substrate 303) blocks the light and the one or more laser sensors 280 are triggered. The one or more lasers 280 are triggered as the emitted light is no longer reflected and collected by the one or more laser sensors 280 at the same level as prior to the substrate 303 blocking the light. The light blocked by the substrate 303 is used to measure a plurality of first locations 501-504 along an outer perimeter 510 of the substrate 303. Each of the plurality of first locations 501-504 is located in the X-Y plane, and has a respective X-coordinate ($X_1$) and Y-coordinate ($Y_1$). The first locations 501-504 are used to calculate a pre-processing location 505 of the center of the substrate 303 prior to the first processing operation being conducted.

As the robot blade 226 and the substrate 303 supported thereon retract out of the processing chamber 300, away from the ESC 366, and away from the substrate access port 331, the robot blade 226 and the substrate 303 move in a second direction D2 in the X-Y plane. As the robot blade 226 and the substrate 303 move in the second direction D2, the substrate 303 moves past light emitted by the one or more laser sensors 280. As the substrate 303 moves past the light emitted by the one or more laser sensors 280 in the second direction D2, the substrate 303 (e.g., the outer perimeter of the substrate 303) blocks the light and the one or more laser sensors 280 are triggered. The one or more laser sensors 280 are triggered as the emitted light is no longer reflected and collected by the one or more laser sensors 280 at the same level as prior to the substrate 303 blocking the light. The light blocked by the substrate 303 is used to measure a plurality of second locations 511-514 along the outer perimeter 510 of the substrate 303. Each of the plurality of second locations 511-514 is located in the X-Y plane, and has a respective X-coordinate ($X_2$) and Y-coordinate ($Y_2$). The second locations 511-514 are used to calculate a post-processing location 515 (e.g., a shifted location) of the center of the substrate 303 after the first processing operation is conducted on the substrate 303. A post-processing shift 520 between the post-processing location 515 and the pre-processing location 505 is determined by determining a distance between the post-processing location 515 and the pre-processing location 505. The post-processing shift 520 can include an X-axis shift and a Y-axis shift. The post-processing shift 520 is a difference, such as a distance, between the pre-processing location 505 and the post-processing location 515.

For each of the pre-processing location 505 and the post-processing location 515, the respective first locations 501-504 and second locations 511-514 are used with a known parameter (such as a radius R1) of the substrate 303 in a pythagorean calculation to calculate the pre-processing location 505 and the post-processing location 515. In one example, half of a first Y-distance DY1 between first location 501 and first location 503 is used with the radius R1 in the pythagorean calculation to calculate a first X-distance DX1 between the first Y-distance DY1 and the pre-processing location 505 of the center of the substrate 303. Half of a second Y-distance DY2 between first location 502 and first location 504 is used with the radius R1 in the pythagorean calculation to calculate a second X-distance DX2 between the second Y-distance DY2 and the pre-processing location 505 of the center of the substrate 303.

Each of the pre-processing location 505 and the post-processing location 515 can be determined in relation to a reference point 530 to determine the post-processing shift 520. The reference point 530 can be a reference point disposed along the robot blade 226, such as along a central axis 531 of the robot blade 226.

Figure 6:
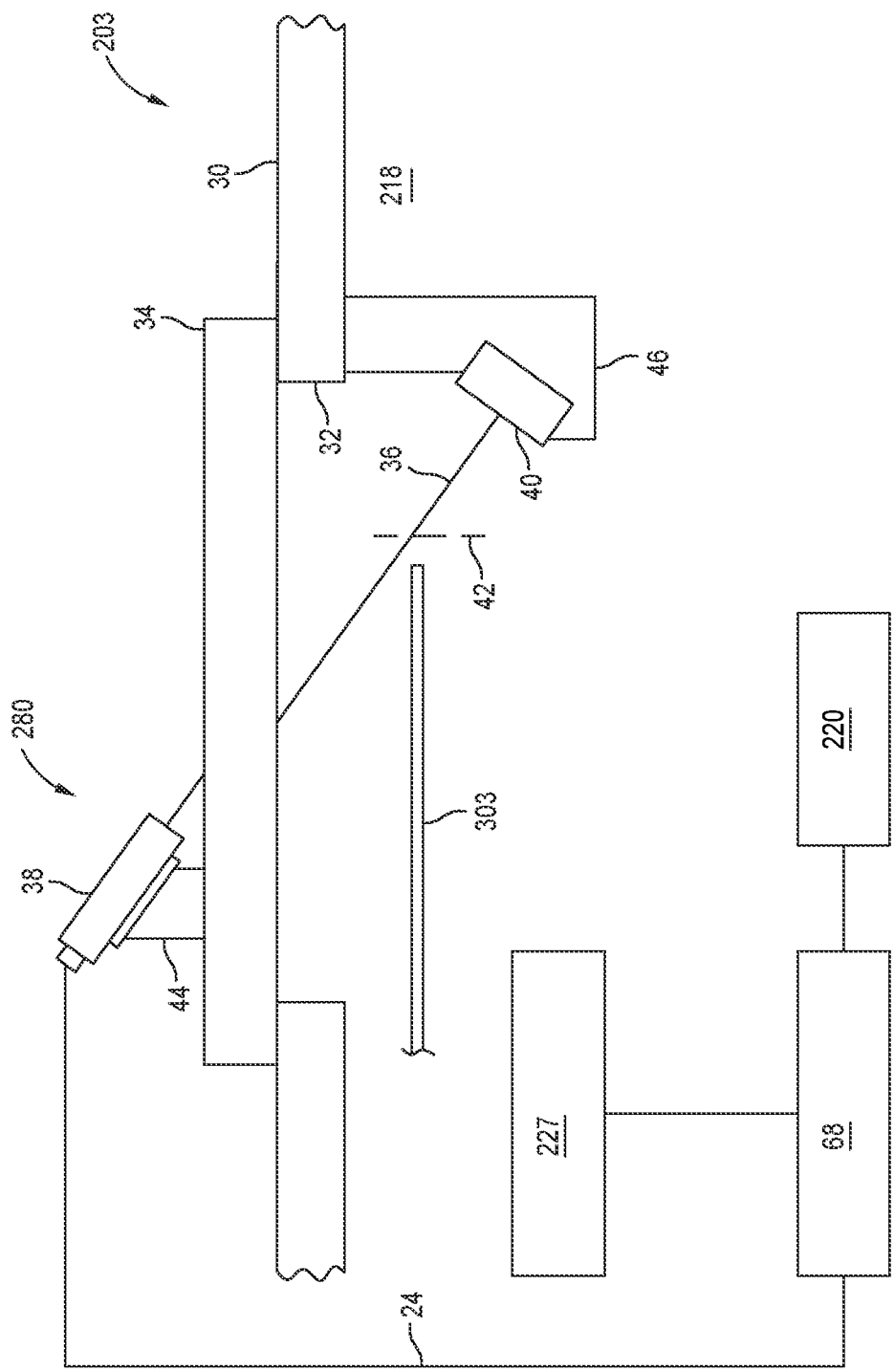
FIG. 6 is a schematic side view of the substrate supported on the robot blade of the robot shown in FIG. 3A, according to one implementation.

FIG. 6 is a schematic side view of the substrate 303 supported on the robot blade 226 of the robot 227 shown in FIG. 3A, according to one implementation. A central cover 30, which defines an upper bound of the volume 218 of the second chamber 203 (e.g., a transfer chamber) has a generally circular opening 32 which is sealed with a window 34, which might be a thick plexiglass plate, allowing the interior of the second chamber 203 to be viewed from above.

The one or more laser sensors 280 detect when the outer perimeter of the substrate 303 interrupts a beam of light 36 passing through the second chamber 203. This may be done in a variety of ways. For example, a light source may be disposed above the central cover 30 so as to direct a beam of light through the window 34 onto the surface of an optical detector. The output of the optical detector has a first value when the beam of light is incident on the surface of the optical detector and has a second value when the beam of light is not incident on the optical detector (such as when the beam of light is blocked by the substrate 303). When the outer perimeter of the substrate 303 passes through the optical beam path 36, blocking the path from the light source (the one or more laser sensors 280) to the detector, the output of the detector will change from the first value to the second value. By noting the position of the robot 227 when the detector output changes values, center information for the substrate 303 can be determined. A controller 68 is provided in the system 200. The controller 68 derives substrate 303 center information from information provided by the robot 227 and the one or more laser sensors 280. As is schematically illustrated in FIG. 2, the controller 68 may be coupled to the controller 220. The controller 68 can be in communication with the controller 220 or can be integrated into the controller 220.

The one or more laser sensors 280 emit an optical beam path 36 and outputs a signal of a first value when the optical beam path 36 is uninterrupted and outputs a signal of a second value when the optical beam path 36 is blocked, such as blocked by the substrate 303. Each of the one or more laser sensors 280 includes a reflex sensor 38 having a light source and a detector in a single housing. The reflect sensor 38 can include the Comet 100 Visible Red Reflex Sensor, DC Model 14102A6517, manufactured by Eaton Corporation of Everett, Wash. FIG. 6 shows the one or more laser sensors 280 located with the light source and the detector on the outside of the second chamber 203. Light 36 from the reflex sensor 38 is directed through the window 34 in the central cover 30 into the second chamber 203 and toward the floor of the second chamber 203. The light 36 is reflected from a reflector 40 back toward the reflex sensor 38 and the returning light beam is detected by the detector within the reflex sensor 38. In one embodiment, the reflector 40 includes a corner cube prism. A corner cube has the property of reflecting all light rays incident within a given solid angle from the normal to the surface of the corner cube back toward the source (e.g., the reflex sensor) of the light rays. A corner cube prism generally has the form of a cube cut along a diagonal plane of the cube so that only a single corner of the cube is left intact. When used as a reflector, the corner cube is disposed so that light is incident on the diagonal plane and is substantially directed to the remaining corner of the cube. Light rays incident on the surface of a corner cube reflector are reflected back toward the source of the light rays even if the surface of the corner cube is not perpendicular to the incident light rays. Accordingly, corner cubes need not be precisely aligned when used as the reflector 40 of the present disclosure. The present disclosure contemplates that other reflectors, such as mirrors, can be used for the reflector 40. The corner cube may be, for example, a Stock No. 42.0015 Corner Cube Prism manufactured by Rolyn Optics Company of Covina, Calif.

The reflex sensor 38 is mounted to the window 34 by a holder 44 that allows slight alignment adjustments of the reflex sensor 38. The reflector 40 is mounted to the bottom of the second chamber 203 cover by a stable holder 46. The holders 44 and 46 are disposed so that the optical path between the reflex sensor 38 and the reflector 40 will intercept the outer perimeter of the substrate 303 being transported by the robot 226 at a position disposed away from (e.g, outside of) the edge of the blade 227 (not shown in FIG. 6) of the robot 226.

The one or more laser sensors 280 have a number of advantages for use in the system 200 of the present application. The reflex sensor 38 preferably emits and detects modulated visible laser light (such as red light), allowing the reflex sensor 38 to discriminate the beam of light 36 from the visible background radiation typically present in wafer processing environments. Synchronizing the optical detector of within the reflex sensor 38 with the modulation signal used to modulate the input red light signal reduces the likelihood of erroneous signal detection. Likelihood of erroneous signals is also reduced by the detection geometry and orientation of the one or more laser sensors 280. The reflex sensor 38, beam path 36 and the normal to the surface of the reflector 40 are all situated at an oblique angle to the surfaces of the window 34 in the central cover 30, reducing the possibility of detecting light reflected either by the window 34 or the wafer 10. This geometry also reduces the likelihood that a background or ambient light source will erroneously be detected by the reflex sensor 38 as a substrate position signal.

The reflex sensor 38 has the further advantage that the detector output switches between two signal levels, which correspond to the typical logical one and zero of computer systems, when the intensity of the light incident on the detector rises above or falls below a predetermined threshold level. Accordingly, the output of the reflex sensor 38 is readily compatible with the controller 220 that controls substrate transport and the system 200 of the present disclosure. If an optical detector is used which outputs signals which are not directly computer compatible, then methods (such as signal conversion methods) convert the detector output to a computer compatible signal.

Benefits of the present disclosure include accurate determination of voltage adjustments, improved chucking voltages, and maintaining target chucking forces; enhanced processing operations and enhanced processing accuracy; reduced or eliminated chance of substrate sticking and/or substrate breakage; reduced or eliminated chance of substrate pop-off; reduced occurrences of frontside defects and backside defects; and increased operational lifespans of electrostatic chucks. Benefits of the present disclosure also include reduced operational times, reduced replacement costs and operational costs, reduced machine downtime, reduced expenditure of resources, and increased throughput. The techniques described herein can determine if a chucking force applied to substrates has changed when the same chucking voltage is applied, and facilitate improved substrate-to-substrate force control across ESC lifespans. Such chucking force change can result from deposition of contaminants on ESC surfaces (such as the recessed surface 345), roughening of ESC surfaces (such as from exposure to plasma), and/or gradual removal of ESC material (such as erosion or wear of portions of the plurality of mesas 346 occurring over processing iterations). Benefits of the present disclosure also include using existing chamber equipment to accurately determine if an adjusted chucking voltage is needed based on the occurrence of the process shift.

Techniques described herein achieve the aforementioned benefits over conventional operations that involve measuring a voltage on the substrate, and operations that involve measuring a pressure or force on the substrate. The techniques described herein facilitate beneficial results over other operations with respect to efficiency and accurately maintaining target chucking voltages. As an example, the techniques described herein facilitate beneficial results over other operations as the techniques described herein can accurately account for chucking forces applied to substrates, rather than relying on current or voltage measurements in chambers. As another example, techniques described herein can accurately determine in a real-time manner when a voltage adjustment is needed.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

What is claimed is:

1. A method of chucking a substrate, comprising:
conducting a first processing operation on the substrate in a processing chamber, the first processing operation comprising:
  applying a chucking voltage to an electrostatic chuck (ESC) in the processing chamber while the substrate is supported on the ESC;
  determining that a process shift has occurred, the determining that the process shift has occurred comprising:
    determining that a center of the substrate has moved by a post-processing shift from a pre-processing location of the center prior to the first processing operation to a post-processing location, wherein the determining if the center of the substrate has moved by the post-processing shift comprises:
    lifting the substrate from the ESC;
    moving the substrate past light emitted by a plurality of sensors after the conducting the first processing operation;
    determining a plurality of locations along an outer perimeter of the substrate, the plurality of locations being located in the X-Y plane;
    calculating a post-processing location of the center using the plurality of locations; and
    determining that a distance between the post-processing location and the pre-processing location meets or exceeds the predetermined threshold, wherein the predetermined threshold is within a range of 0.5 mm to 10 mm; and
  determining an adjusted chucking voltage based on the occurrence of the process shift.

2. The method of claim 1, wherein the moving the substrate past the light emitted by the plurality of sensors comprises moving a robot blade while the substrate is supported on the robot blade.

3. The method of claim 1, wherein the determining the adjusted chucking voltage comprises conducting a pop-off operation on a workpiece, the workpiece comprising the substrate or a second substrate, the pop-off operation comprising:
  applying an initial chucking voltage to the ESC supporting the workpiece;
  flowing a backside gas to a backside surface of the workpiece; and
  ramping up or down the initial chucking voltage to a leak voltage at which the backside gas leaks past an outer edge of the workpiece at a leak rate that exceeds a leak threshold.

4. The method of claim 3, wherein the leak threshold is within a range of 2.0 sccm to 5.0 sccm.

5. The method of claim 3, wherein the adjusted chucking voltage is determined by adding or subtracting a safety voltage margin to or from the leak voltage.

6. The method of claim 5, further comprising conducting a second processing operation on the substrate, the second substrate, or a third substrate in the processing chamber, the second processing operation comprising:
  applying the adjusted chucking voltage to the ESC while the substrate, the second substrate, or the third substrate is supported on the ESC.

7. A non-transitory computer readable medium for conducting chucking operations comprising instructions that, when executed, cause a plurality of operations to be conducted, the plurality of operations comprising:
conducting a first processing operation on a substrate in a processing chamber, the first processing operation comprising:
  applying a chucking voltage to an electrostatic chuck (ESC) in the processing chamber while the substrate is supported on the ESC;
  determining that a process shift has occurred, the determining that the process shift has occurred comprising one or more of:
    determining that a center of the substrate has moved by a post-processing shift from a pre-processing location of the center prior to the first processing operation to a post-processing location, wherein the determining if the center of the substrate has moved by the post-processing shift comprises:
    lifting the substrate from the ESC;
    moving the substrate past light emitted by a plurality of sensors after the conducting the first processing operation;
    determining a plurality of locations along an outer perimeter of the substrate, the plurality of locations being located in the X-Y plane;
    calculating a post-processing location of the center using the plurality of locations; and
    determining that a distance between the post-processing location and the pre-processing location meets or exceeds the predetermined threshold, wherein the predetermined threshold is within a range of 0.5 mm to 10 mm; and
  determining an adjusted chucking voltage based on the occurrence of the process shift.

8. The non-transitory computer readable medium of claim 7, wherein the moving the substrate past the light emitted by the plurality of sensors comprises moving a robot blade while the substrate is supported on the robot blade.

9. The non-transitory computer readable medium of claim 7, wherein the determining the adjusted chucking voltage comprises conducting a pop-off operation on a workpiece, the workpiece comprising the substrate or a second substrate, the pop-off operation comprising:
  applying an initial chucking voltage to the ESC supporting the workpiece;
  flowing a backside gas to a backside surface of the workpiece; and
  ramping up or down the initial chucking voltage to a leak voltage at which the backside gas leaks past an outer edge of the workpiece at a leak rate that exceeds a leak threshold.

10. The non-transitory computer readable medium of claim 9, wherein the leak threshold is within a range of 2.0 sccm to 5.0 sccm.

11. The non-transitory computer readable medium of claim 9, wherein the adjusted chucking voltage is determined by adding or subtracting a safety voltage margin to or from the leak voltage.

12. The non-transitory computer readable medium of claim 11, wherein the plurality of instructions further comprise conducting a second processing operation on the substrate, the second substrate, or a third substrate in the processing chamber, the second processing operation comprising:
applying the adjusted chucking voltage to the ESC while the substrate, the second substrate, or the third substrate is supported on the ESC.

\* \* \* \* \*